United States Patent
Shen et al.

(10) Patent No.: US 6,534,411 B1
(45) Date of Patent: Mar. 18, 2003

(54) METHOD OF HIGH DENSITY PLASMA METAL ETCHING

(75) Inventors: Lewis Shen, Cupertino, CA (US); Wenge Yang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/548,616

(22) Filed: Apr. 13, 2000

Related U.S. Application Data

(60) Provisional application No. 60/148,579, filed on Aug. 13, 1999.

(51) Int. Cl.[7] .............................................. H01L 21/302
(52) U.S. Cl. ..................... 438/706; 438/714; 438/719
(58) Field of Search ................ 438/706, 719, 438/721, 723, 588, 592, 593, 655–657, 683, 714

(56) References Cited

U.S. PATENT DOCUMENTS

| | | | | |
|---|---|---|---|---|
| 4,222,838 A | * | 9/1980 | Bhagat et al. | 204/192 E |
| 5,605,601 A | * | 2/1997 | Kawasaki | 156/643.1 |
| 5,948,703 A | * | 9/1999 | Shen et al. | 438/714 |
| 6,057,603 A | * | 5/2000 | Dawson | 257/758 |
| 6,093,653 A | * | 7/2000 | Kim et al. | 438/706 |
| 6,159,860 A | * | 12/2000 | Yang et al. | 438/706 |

\* cited by examiner

Primary Examiner—Robert Kunemund
Assistant Examiner—Duy-Vu Deo

(57) ABSTRACT

The high density plasma metal etch rate of a conductive material within a dense array of conductive lines is increased to greater than the etch rate of the conductive material in a bordering open field by controlling the source power and the bottom power in a plasma chamber, thereby reducing overetching, resist loss, and oxide loss in the open field, and facilitating planarization.

17 Claims, 4 Drawing Sheets

METHOD OF HIGH DENSITY PLASMA METAL ETCHING

CLAIM OF PRIORITY

This application claims priority from U.S. Provisional Patent Application Serial No. 60/148,579, filed on Aug. 13, 1999.

TECHNICAL FIELD

The present invention relates to a method of manufacturing a semiconductor device wherein a dense array of conductive lines is etched at a rate faster than the rate at which the conductive lines are etched in a bordering open field.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. This objective becomes particularly difficult to achieve given the economic pressure for high speed production and challenges the limitations of semiconductor technology. Thus, the combined requirements of high speed and high density conductive wiring patterns pose a challenge which, to date, has not been satisfactorily achieved.

A traditional method for forming a dense array of conductive lines comprises the use of a subtractive etch back step as the primary metal-patterning technique. This traditional technique basically comprises forming an insulating dielectric layer on a substrate, such as monocrystalline silicon, depositing a conductive layer, such as aluminum, tungsten, polysilicon, tungsten silicide (WSi), or titanium silicide, forming a photo-resist mask having a pattern defining a dense array of conductive lines bordered by an open field wherein the distance between the conductive lines is considerably greater than the distance between conductive lines in the dense array, and etching through the mask. Typically, the etch rate in the dense array of conductive lines is slower than the corresponding open field.

Etching is normally conducted until a material is substantially removed between the conductive lines of the dense array along with any residues which may have formed. Conventionally, overetching must be performed to remove a portion of the underlying oxide to ensure complete removal of products between conductive lines to avoid shorting. As employed throughout this application, the expression "open field" denotes an area wherein conductive lines are separated by a distance of at least 2.0 microns, while the expression "dense array" denotes a pattern of conductive lines which are separated by a distance of less than 1.0 micron.

A problem typically encountered when etching a layer to form a dense array of lines bordered by an open field is that the etch rate of materials within the dense array is inevitably slower than the etch rate of materials in the bordering open field. This etch rate differential is commonly referred to as the "etch rate microloading" and results in "undercutting" of the material within the dense array of lines.

The etch rate differential between the rate within the dense array as compared with the bordering open field, or etch rate microloading, generates numerous problems which are exacerbated as integration increases and smaller interwiring spacings are required within dense arrays. For example, the etch rate microloading phenomenon causes problems such as undercutting of the various layers within the dense array, since it is virtually impossible to determine the etch end point within the dense array with a reasonable degree of accuracy. Significantly, the speed at which semiconductor devices can be manufactured is compromised because more time is required to adequately etch layers within the dense array. Additional problems stemming from the etch rate microloading include the formation of sloping profiles on leading and tailing conductive lines, and increased time and work for planarizing a subsequently applied dielectric layer.

U.S. Pat. No. 5,702,564, issued on Dec. 30, 1997 a method is disclosed for reducing undercutting of conductive lines within a dense array by changing one or more of the initial etching conditions at a strategic point in the etching process.

Copending application Ser. No. 08/423,495, filed on Apr. 19, 1995, now abandoned, discloses a method or preventing undercutting of conductive lines in a dense array by providing one or more non-functional dummy or conductive lines in the bordering open field.

Copending application Ser. No. 08/657,261 (Our Docket No. 1033-154), discloses a method of increasing the etch rate within the dense array by etching the conductive layer through a mask with a high density plasma generated by a gas flow containing a sufficient amount of nitrogen.

Heightened demands for minimal interwiring spacings associated with ultra large scale integration amplify the impact of the etch rate microloading phenomenon on the manufacturing of semiconductor devices. For example, upon detection of the etch end point of a metal layer in an open field bordering a dense array, a substantial amount of metal remains between conductive lines within the dense array. It was found that the etch rate differential becomes even more pronounced as the distance between the conductive lines of the dense array decreases. Thus, as integration increases, a much longer overetch time is required to ensure that metal lines within the dense array are formed free of bridging. Longer overetch time necessarily involves longer processing time and, hence, reduced throughput. Moreover, a longer overetch time increases the amount of resist lost and requires a deeper oxide cut in the open field. These adverse consequences of the etch rate microloading phenomenon render it extremely difficult to continue employing conventional methodology for submicron geometry etching of conductive lines within a dense array.

There exists a need to provide semiconductor methodology, wherein the etch rate microloading is reduced to zero and even reversed by an efficient, cost-effective and simplified technique to satisfy the demands of ultra large scale integration for increasingly denser arrays with minimal interwiring spacing between conductive lines.

DISCLOSURE OF THE INVENTION

An advantage of the present invention is a method of manufacturing a semiconductor device having a dense array of conductive lines wherein the etch rate within the dense array is increased to greater than the etch rate in the bordering open field.

Additional advantages of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other advantages are achieved in part by a method of manufacturing a semiconductor device having a dense array of conductive lines comprising: forming an insulating layer; forming a layer of conductive material on the insulating layer; forming a polysilicon capping layer on the conductive layer; forming a mask on the polysilicon capping layer, which mask contains a pattern defining a dense array of conductive lines bordered by an open field; and etching the polysilicon capping layer through the mask with a high density plasma generated in a plasma processing chamber while selectively controlling a source power and a bottom power to increase the etch rate of the polysilicon capping material within the dense array to greater than the etch rate of the polysilicon capping material in the open field.

U.S. Pat. No. 5,795,829, issued on Aug. 18, 1998, discloses a method of increasing the etch rate within the dense array by etching the conductive layer through a mask with a high density plasma generated by a gas flow containing a sufficient amount of nitrogen.

DESCRIPTION OF THE INVENTION

The present invention addresses and solves problems stemming from the high density plasma etch rate differential of a layer, e.g., a polysilicon capping layer, within a dense array as compared with a bordering open field, i.e., the etch rate microloading phenomenon. Such problems stemming from the etch rate microloading phenomenon include bridging between conductive lines, resist lost, deep oxide cuts in the open field and time consuming planarization, are exacerbated as the distance between conductive lines of a dense array is decreased to satisfy the demands for ultra-large scale integration, e.g., less than 0.18 microns.

Figure 1A:
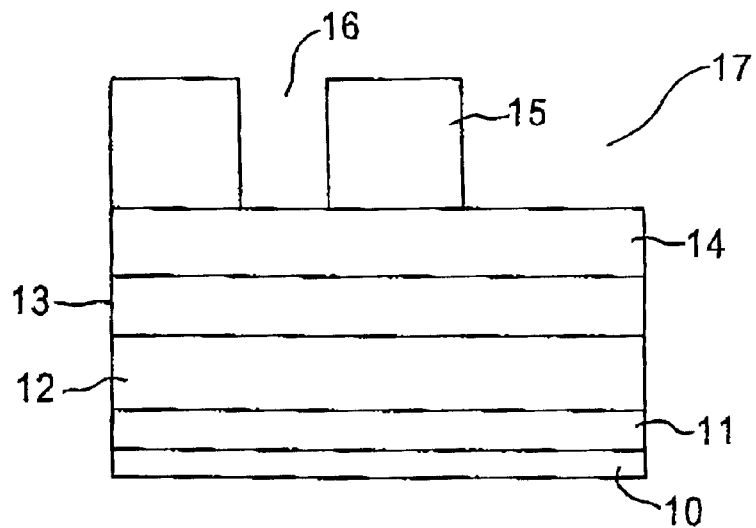
FIGS. 1(A)–1(F) schematically illustrate sequential phases of a conventional etching process for forming a dense array.
Figure 1B:
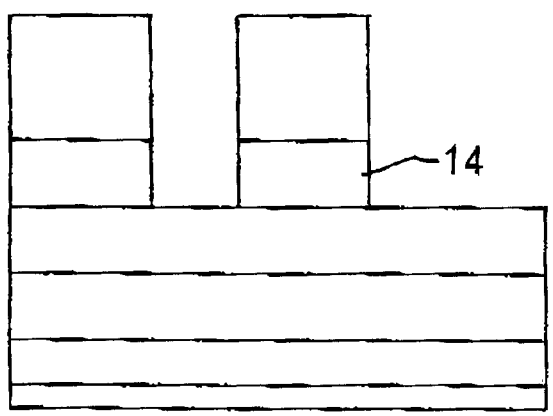
Figure 1C:
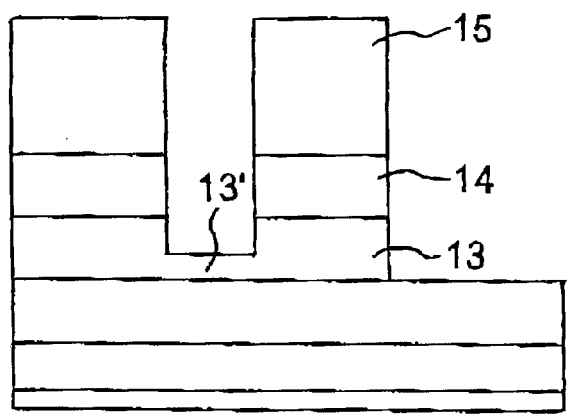
Figure 1D:
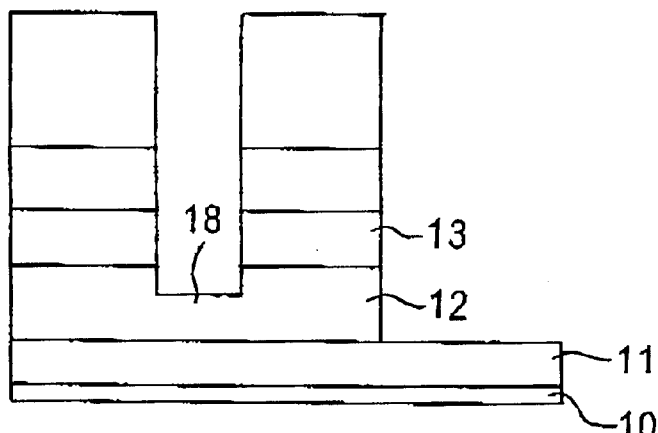
Figure 1E:
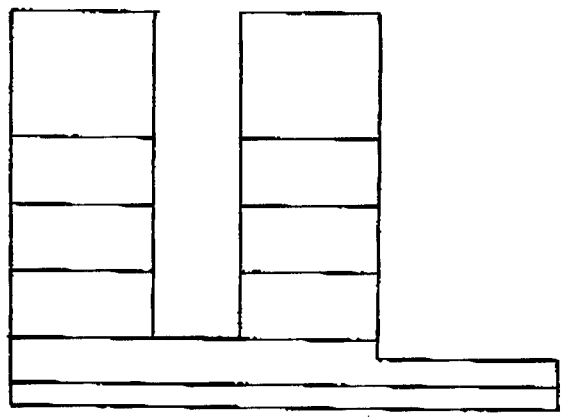
Figure 1F:
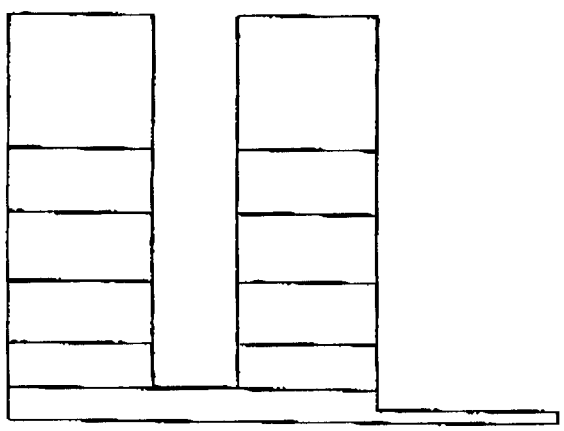

A typical high density plasma etching technique employing conventional etching chemistry, such as chemistry predicated upon chlorine gas and boron trichloride, conducted in a TCP type of apparatus, comprises the generation of Cl as the etching species. As shown in FIG. 1(A), an oxide layer 10, such as silicon dioxide is formed on a semiconductor substrate (not shown). A polycrystalline silicon (polysilicon) layer 11 is formed on oxide layer 10. A conductive layer 12, such as a metal, e.g. tungsten silicide (WSi), is formed on polysilicon layer 11. A capping layer 13, such as polysilicon is formed on conductive layer 12. An antireflective coating (ARC) layer 14 such as silicon oxynitride, is formed on capping layer 13. A photoresist layer is then formed on ARC layer 14 and developed in a conventional manner to form a photoresist mask 15 containing a pattern 16 defining a dense array of conductive lines bordered by an open field 17. The ARC layer 14 is etched, as schematically illustrated in FIG. 1(B). Thereafter, the polysilicon layer 13 is etched until the etch end point is detected in the open field, as shown in FIG. 1(C). However, at the time such etch end point is detected in the open field, excess polysilicon 13' remains within the dense array. Adverting to FIG. 1(D), the conductive layer 12 is then etched. Excess metal 18 remains within the dense array. Overetching is then conducted, as shown in FIG. 1(E), to remove metal 18 bridging conductive lines in the dense array, and any residue, such as silicon and copper which are usually present in typical aluminum alloys employed for forming conductive lines in the semiconductive industry, or titanium or titanium nitride in the event a conventional barrier layer is employed. Adverting to FIG. 1(F), polysilicon layer 11 is then etched. However, with continued reference to FIG. 1(F), the thickness of the oxide layer in the bordering open field is substantially less than the thickness of the oxide layer within the dense array.

In accordance with the present invention, the problems attendant upon conventional high density plasma etching techniques to form a pattern of conductive lines within a dense array, notably the problems stemming from the etch rate microloading phenomenon, are solved by an efficient cost-effective technique, whereby the etch rate microloading phenomenon is brought to zero or reversed. Thus, in accordance with the present invention, the etch rate of the polysilicon capping layer is increased to at least the etch rate of the polysilicon layer in a bordering open field to achieve reversed etch rate microloading. In accordance with the present invention, the etch rate of the polysilicon material within the dense array is raised as to exceed the etch rate of the polysilicon material in a bordering open field, thereby reversing the etch rate microloading phenomenon.

In accordance with the present invention, reversed etch microloading is achieved by an elegantly simplified, cost-effective technique of separately controlling the source power and bottom power in a plasma processing chamber to increase the etch rate of the polysilicon material within the dense array to no less than the etch rate of the polysilicon material in the open field.

As employed throughout this application, the expression "source power" denotes the power which controls the total amount of reactive ions generated in an etch chamber. Source power controls the overall etch rate, for example, a higher source power generates more reactive ions thereby increasing the total etch rate for certain films. The expression "bottom power" denotes the power which controls the ion bombardment energy at the wafer surface. Bottom power controls the acceleration of reactive ions that bombard the wafer surface, for example, higher bottom power increases the ion energy at the wafer surface and improves the ion bombardment.

In conducting the present invention, conventional high density plasma etching chemistry conditions and equipment can be employed. The invention can be practiced by introducing a high reversed microloading etch recipe in a plasma chamber while separately controlling the source power and the bottom power to elevate the etch rate of the polysilicon within the dense array to achieve reversed etch rate microloading. Given the stated objective, the optimum source power and bottom power, as well as other process parameters can be readily determined for a given situation, e.g., for a particular material, geometry and etching chemistry. In practicing embodiments of the present invention, the source power and bottom power are separately controlled so that the source power is typically greater than the bottom power. For example, it has been found that when the source power is about 1000 W to about 2000 W, and bottom power is about 50 W to about 150 W, to achieve reversed etch rate microloading. Thus, the present invention stems from the discovery that the etch rate of a material, such as polysilicon, within a dense array is elevated as compared with a bordering open field by individually controlling the source power and bottom power to generate a high density plasma.

Thus, in accordance with the present invention, the source power and bottom power are independently controlled to achieve reversed etch rate microloading, wherein the etch rate within the dense array is faster than the bulk etch rate e.g., the etch rate in the dense array can be about 40% greater than the bulk etching rate in the bordering open field. As a result, various benefits are achieved. For example, overetching to avoid bridging is eliminated. In addition, the amount of oxide lost in the open field due to overetching is reduced with an attendant advantageous reduction in the amount of dielectric material required for subsequent planarization.

Figure 2A:
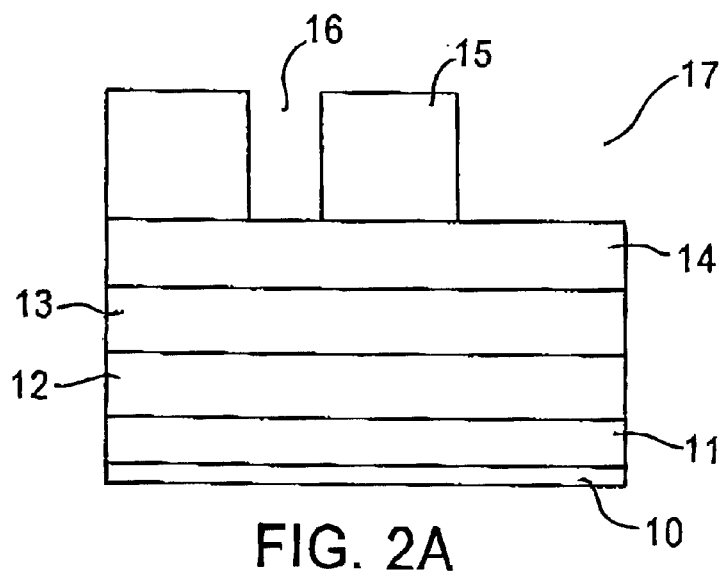
FIGS. 2(A)–2(F) schematically illustrate sequential phases of an embodiment of the present invention.
Figure 2B:
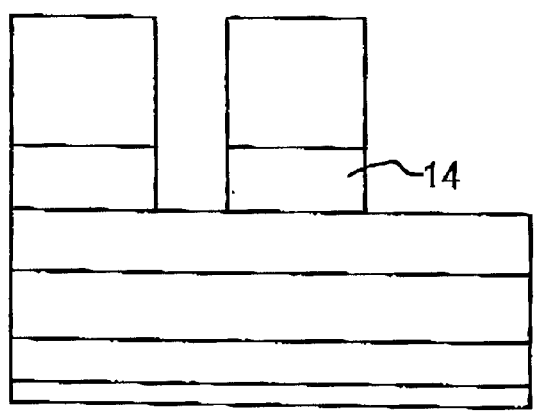
Figure 2C:
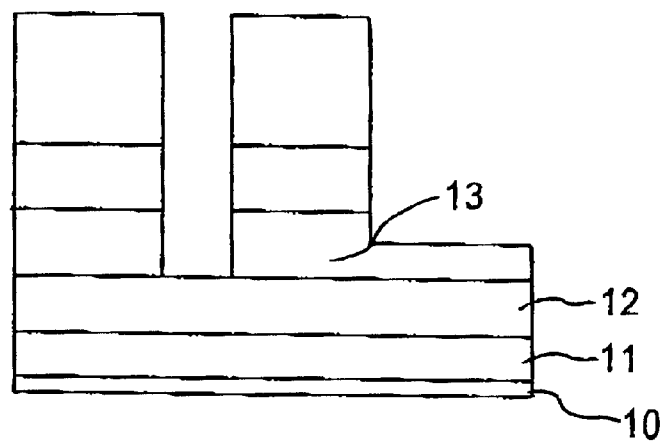
Figure 2D:
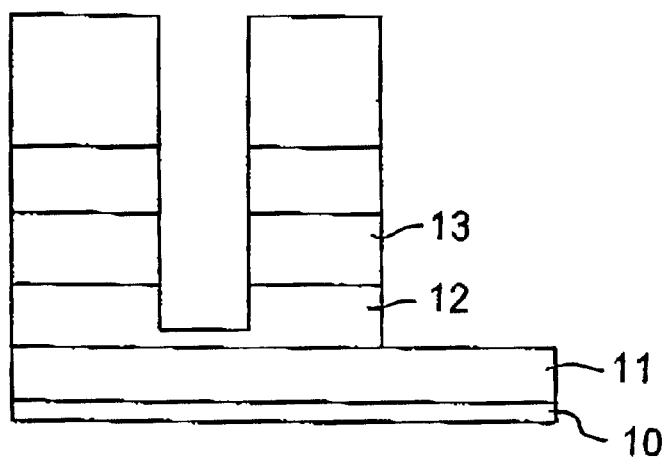
Figure 2E:
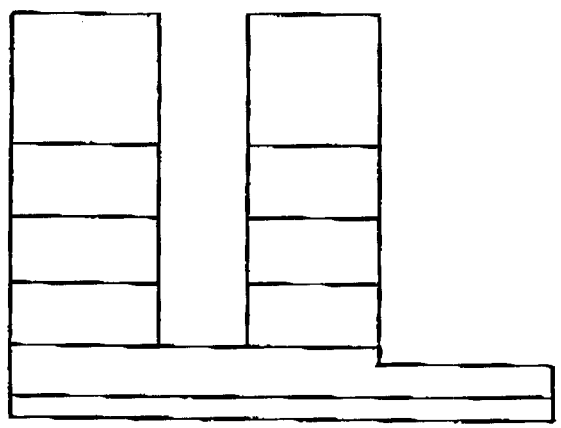

As shown in FIG. 2(A), a polysilicon layer 11 is deposited by conventional techniques on oxide layer 11 formed on a semiconductor substrate (not shown). A polysilicon layer 11 is formed on oxide layer 10. A conductive layer 12 is formed on polysilicon layer 11. A capping layer 13, such as polysilicon, is formed on conductive layer 12. An antireflective coating (ARC) layer 14, such as silicon oxynitride (SION) is formed on capping layer 13. A photoresist layer is then formed on ARC layer 14 and developed in a conventional manner to form photoresist mask 15 containing a pattern defining a dense array of conductive lines bordered by an open field 17. The ARC layer 14 is etched as in FIG. 2(B), as in an oxide chamber (MxP by AMAT). Employing an appropriate source power and an appropriate bottom power, reversed etch microloading is achieved in, for example, a high density plasma tool whereby, unlike in conventional methodology depicted in FIG. I(C), the etch rate of the polysilicon capping layer 13 within the dense array is equal to or exceeds the etch rate of the polysilicon layer in the bordering open field. As shown in FIG. 2(D), in accordance with the present invention, etching is continued until the metal layer is removed from the open field. It is preferred that all the conductive layer 12 is removed from the dense array before the underlying oxide 10 is exposed. As shown in FIG. 2(E), the remaining conductive layer within the dense array is removed, resulting in a slight overetching of the polysilicon layer in the bordering open field. Thereafter, polysilicon layer 11 is removed, as by etching.

The advantages of the present invention are apparent from a comparison of FIGS. 2(A)–2(F) as compared with FIGS. 1(A)–1(F). For example, in accordance with the present invention, the etch rate microloading phenomenon is reversed by an inexpensive simplified technique yielding several advantages. As a result of increasing the high density plasma etch rate of the polysilicon layer in the dense array as compared with the bordering open field, the amount of time required for overetching is considerably reduced, thereby increasing production throughput with an attendant economic benefit.

Figure 2F:
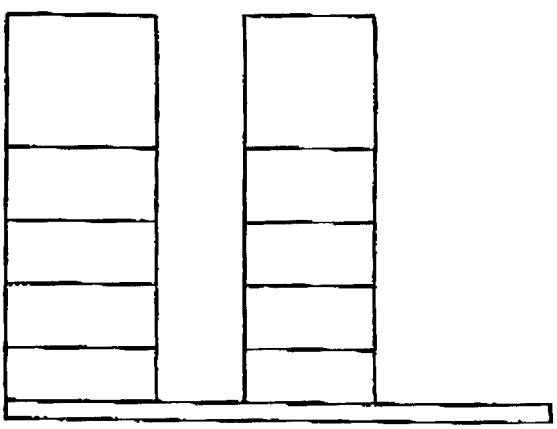

The method of the present invention also results in less field oxide removal. Accordingly, a significant advantage of the present invention resides in reducing the amount of the applied interlayer oxide. With reference to FIG. 2(F) of the present invention, the oxide layer 10 is substantially the same thickness within the array and in the bordering open field.

In addition, the present invention advantageously enables a significant reduction in the amount of dielectric material employed in subsequent processing prior to planarization. Since less oxide is removed from the open field, the planarization dielectric may be applied at a thickness which is considerably less than the thickness of conventional methodology. Since less planarization dielectric is required, planarization can be effected more rapidly, thereby further increasing cycle time and production throughput. The present invention also enables an improvement in sidewall protection in that more reliable conductive lines are formed.

In view of the resulting sloped profile (not illustrated), the gaps between the conductive lines can be easily filled and, hence, an improvement in production control is also realized.

The present invention has been exemplified without the use of a barrier layer. However, in accordance with the present invention, conventional barrier layers can be employed. For example, in an embodiment of the present invention, a conductive barrier layer is initially deposited on an underlying insulating layer, and the conductive line material, preferably a metal such as aluminum alloy, is deposited on the barrier layer. The barrier layer can be deposited by a conventional technique, such as chemical vapor deposition or physical vapor deposition, and can comprise any material conventionally employed for that purpose, such as titanium.

Basically, the method of the present invention is similar to conventional high density plasma etching of a conductive layer to form a dense array of conductive lines in terms of materials, conditions, equipment, and basic manipulative steps. The present invention departs from conventional practices by introducing nitrogen into the etching chemistry in an amount sufficient to increase the high density plasma etch rate within the dense array to no less than that in a bordering open field. Thus, the present invention is generally applicable to the formation of a dense array of conductive lines, preferably comprising a metal, on an insulating layer formed on a semiconductor substrate. The substrates may be any conventional semiconductor substrate, such as monocrystalline silicon. The insulating layer can be formed by any conventional deposition technique, such as chemical vapor deposition or sputtering, and can comprise any insulating material typically employed in the production of semiconductor devices, such as an oxide, preferably silicon dioxide. The conductive layer can be formed by any conventional deposition technique, such as chemical vapor deposition or sputtering, and can comprise any conventional conductive material normally employed in the production of semiconductor devices, such as aluminum or an alloy, preferably an alloy containing titanium, copper and silicon, tungsten, tungsten silicide or polycrystal line silicon.

The present invention is applicable to various phases in the production of semiconductor devices comprising the formation of dense arrays of conductive lines separated by distances less than about 1.0 micron, preferably less than 0.7 microns, and bordered by an open field having conductive lines separated by distances of at least about 2 microns. The present invention is applicable to any etching rate of the conductive material in the open field is greater than the etching rate of the conductive material in the dense array. The present invention is not limited to the particular materials previously mentioned or exemplified, but enjoys utility in the formation of any type of dense array comprising conductive lines.

Only the preferred embodiment of the present invention and an example of its versatility is shown and described in the present disclosure. It is to be understood that the invention is capable of use in various other combinations and environments and is capable of changes or modifications within the scope of the present invention concept as express herein.

What is claimed is:

1. A method of manufacturing a semiconductor device having a dense array of conductive lines comprising:

forming an insulating layer;

forming a layer of conductive material on the insulating layer;

forming a polysilicon capping layer on the conductive layer; forming a mask on the polysilicon capping layer, which mask contains a pattern defining a dense array of conductive lines bordered by an open field; and etching the polysilicon capping layer through the mask with a high density plasma generated in a plasma processing chamber while selectively controlling a source power and a bottom power to increase the etch rate of the polysilicon capping material within the dense array to greater than the etch rate of the polysilicon capping material in the open field.

2. The method according to claim 1, comprising controlling the source power at about 1000 W to about 2000 W.

3. The method according to claim 1, comprising controlling the bottom power at about 50 W to about 150 W.

4. The method according to claim 1, comprising controlling etching until substantially all of the conductive material is removed between conductive lines of the dense array.

5. The method according to claim 1, comprising etching until all conductive material is removed between conductive lines of the dense array and between conductive lines in the open field.

6. The method according to claim 1, further comprising depositing a dielectric layer on the etched conductive layer and planarizing the deposited dielectric layer by etching or chemical-mechanical polishing.

7. The method according to claim 1, wherein the insulating layer comprises an oxide.

8. The method according to claim 1, wherein the conductive material comprises a metal.

9. The method according to claim 8, further comprising forming a barrier metal layer on the insulating layer, and forming the conductive layer on the barrier layer.

10. The method according to claim 9, wherein the barrier layer comprises titanium.

11. The method according to claim 9 further comprising forming an anti-reflective coating on the conductive layer.

12. The method according to claim 11, wherein the anti-reflective coating comprises silicon oxynitride.

13. The method according to claim 1, wherein the distance between conductive lines in the dense array is less than about 1.0 μm.

14. The method according to claim 13, wherein the distance between conductive lines in the dense array is less than about 0.7 μm.

15. The method according to claim 1, wherein the distance between conductive lines in the open field is at least about 2.0 μm.

16. The method according to claim 1, wherein the high density plasma comprises at least one component selected from the group consisting of chlorine, boron trichloride, carbon tetrafluoride, trifluoromethane, hydrogen bromide and hydrogen chloride.

17. The method according to claim 16, wherein the high density plasma comprises chlorine.

* * * * *